United States Patent
Cho et al.

(10) Patent No.: US 7,439,651 B2
(45) Date of Patent: Oct. 21, 2008

(54) RESONATOR

(75) Inventors: Kyung-il Cho, Seoul (KR); Jong-hwa Won, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 207 days.

(21) Appl. No.: 11/359,392

(22) Filed: Feb. 23, 2006

(65) Prior Publication Data

US 2006/0192463 A1    Aug. 31, 2006

(30) Foreign Application Priority Data

Feb. 28, 2005    (KR)    ........................ 10-2005-0016417

(51) Int. Cl.
*H02N 10/00*    (2006.01)
(52) U.S. Cl. ...................................... 310/321; 310/306
(58) Field of Classification Search ................ 310/306, 310/307, 311, 320, 321, 330–332, 343, 345, 310/346, 348, 350, 351, 365, 352, 353; 331/155; 60/527; 73/504.04, 504.12, 504.14, 504.16; 333/186, 188, 200
See application file for complete search history.

(56) References Cited

U.S. PATENT DOCUMENTS

| 5,685,149 A | * | 11/1997 | Schneider et al. | ............. 60/528 |
| 2005/0162040 A1 | * | 7/2005 | Robert | ........................ 310/322 |
| 2005/0173770 A1 | * | 8/2005 | Linden et al. | ................ 257/414 |

* cited by examiner

*Primary Examiner*—Darren Schuberg
*Assistant Examiner*—Derek J Rosenau
(74) *Attorney, Agent, or Firm*—Sughrue Mion, PLLC

(57) ABSTRACT

A resonator which is capable of modulating frequencies has a main body having a vibrating body and an elastic supporting body supporting the vibrating body and a frequency modulating unit having a movable contacting part that is movable between a first position away from the elastic supporting body and a second position which is contactable with the elastic supporting body. Since there is a variable vibration length of the elastic supporting body during vibration of the vibration body by the contact between the contacting part and the elastic supporting body, it is possible to change the frequency of vibration extracted from the resonator, when it is necessary.

25 Claims, 5 Drawing Sheets

RESONATOR

CROSS-REFERENCE TO RELATED APPLICATIONS

This application claims priority under 35 U.S.C. § 119(a) of Korean Patent Application No. 2005-16417, filed Feb. 28, 2005, the entire contents of which are incorporated herein by reference.

BACKGROUND OF THE INVENTION

Field of the Invention

The present invention relates to a resonator extracting a vibration or a wave of a particular frequency, using the resonance phenomenon.

Generally, the resonator used for a tuner or gyro of a wireless communications device is provided with a vibrating body, an elastic support body vibrationally supporting the vibrating body, and a vibration driving means for vibrating the vibrating body. Features of the resonator are decided by several conditions such as a mass of the vibrating body or a shape of the elastic support body. The features are set in the manufacturing stage of the resonators, but once the resonator is manufactured, it is impossible to change.

There is recently an increasing demand for compound products having multiple functions. Accordingly, resonator-employed products are required to be able to use vibrations or waves of various frequencies.

The above-mentioned conventional resonator is able to output a single resonance frequency. Accordingly, a plurality of resonators with different bandwidths are used or a plurality of uniform resonators are disposed serially or in parallel, in order to selectively extract various resonant frequencies in a conventional way. The conventional method raises manufacturing costs and complicates the manufacturing process of resonator-employed products.

SUMMARY OF THE INVENTION

An aspect of the present invention is to solve at least the above problems and/or disadvantages and to provide at least the advantages described below. Accordingly, an aspect of the present invention is to provide a resonator improved to modulate the frequency of extracted vibrations or waves.

In order to achieve the above-described aspects of the present invention, there is provided a resonator comprising a main body including a vibrating body and an elastic supporting body supporting the vibrating body; and a frequency modulating unit including a movable contacting part which is movable between a first position away from the elastic supporting body and a second position in a vicinity of the elastic supporting body.

The first position is spaced away from a vibration range of the elastic supporting body. The second position is within a vibration range of the elastic supporting body.

In this way, a single resonator is able to extract several resonant frequencies.

According to an exemplary embodiment of the present invention, the frequency modulating unit comprises a length-variable part which is restorable according to temperature, an interference body including the contacting part and at least one heat source selectively heating the interference body to move the contacting part.

The interference body and the contacting part may be formed in a single body. The contacting part may be bent-shaped in parallel with respect to a length direction of the elastic supporting body.

The frequency modulating unit comprises a sensor which measures a temperature of the interference body; and a controller which controls the driving of the heat source corresponding to a signal output from the sensor.

The heat source comprises a heat-generating resistance body installed on one end of the interference body.

The heat-generating resistance body and the interference body may be formed in a single body.

The contacting part is formed at the main body of the resonator in plural numbers, each of which is formed integrally with at least two contacting parts.

A part of the interference body penetrates an outer wall of the main body of the resonator and a heat-transmission preventing body is formed between the interference bodies and the outer wall, to prevent heat of the interference body from being transmitted to the outer wall.

Barriers preventing heat transfer among the interference bodies are formed between the respective interference bodies, the interference body and the vibrating body, and the interference body and an inner wall of the main body of the resonator. The barrier is formed integrally with the outer wall of the main body of the resonator, thereby facilitating the manufacture of the resonator.

The second position may be where the contacting part and the elastic supporting body contact while the elastic supporting body stands still.

BRIEF DESCRIPTION OF THE DRAWING FIGURES

The above aspects and other features of the present invention will become more apparent by describing in detail exemplary embodiments thereof with reference to the attached drawing figures, wherein.

DETAILED DESCRIPTION OF THE EXEMPLARY EMBODIMENTS

Hereinafter, exemplary embodiments of the present invention will be described in detail with reference to the accompanying drawing figures.

Figure 1:
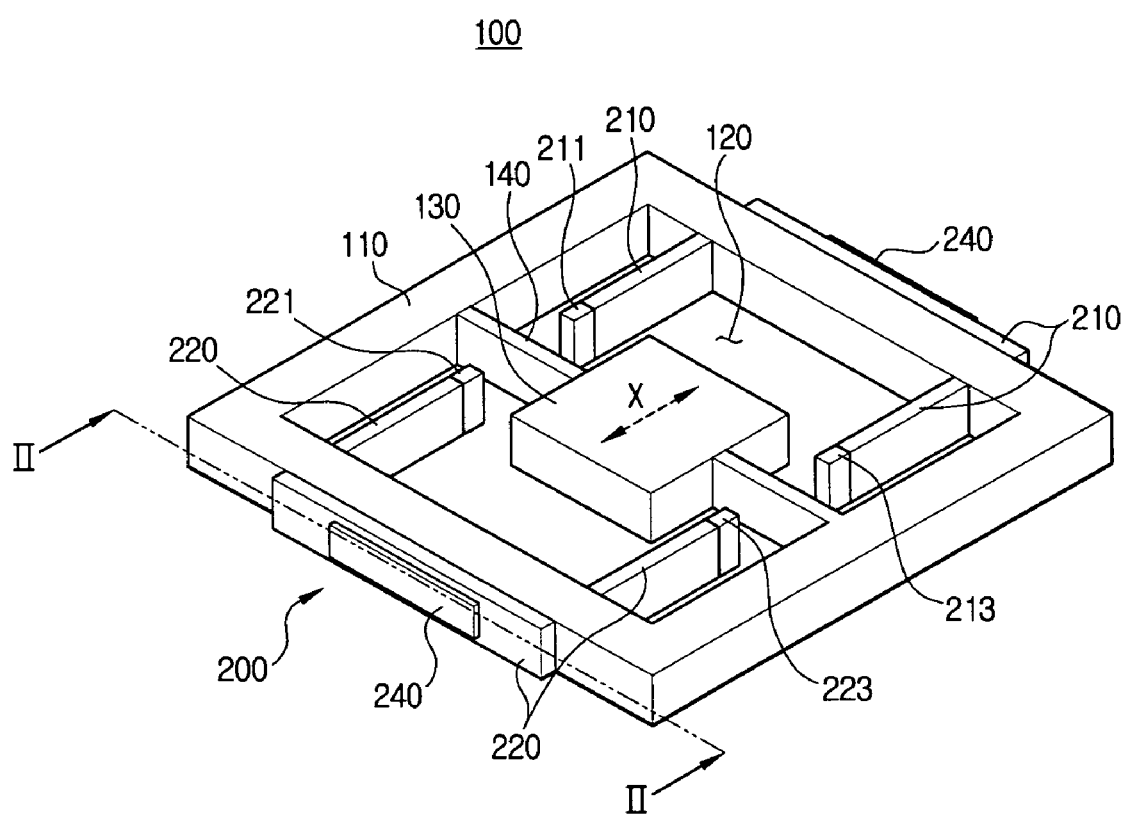
FIG. 1 is a perspective view of a resonator according to a first embodiment of the present invention.
Figure 2:
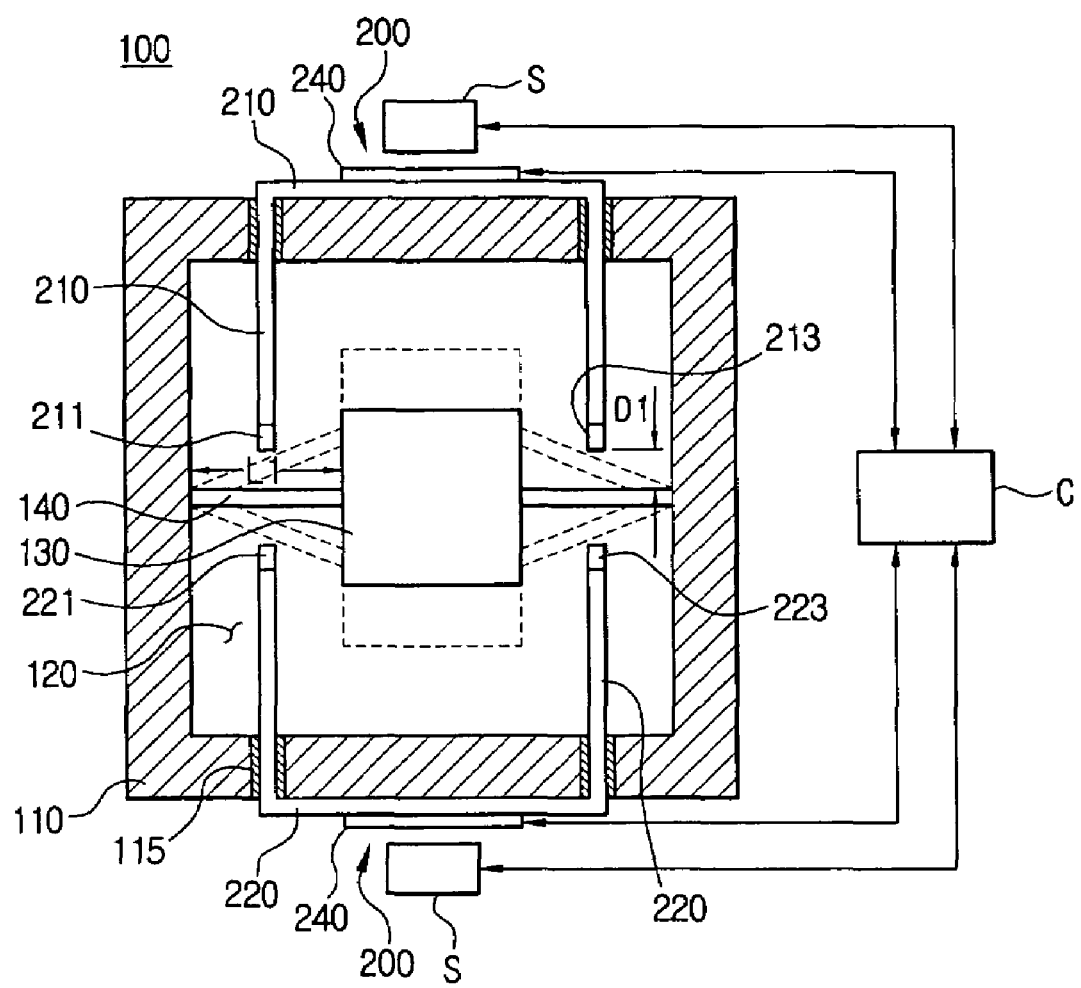
FIG. 2 is a cross-sectional view of the resonator cut-along II-II of FIG. 1.
Figure 3:
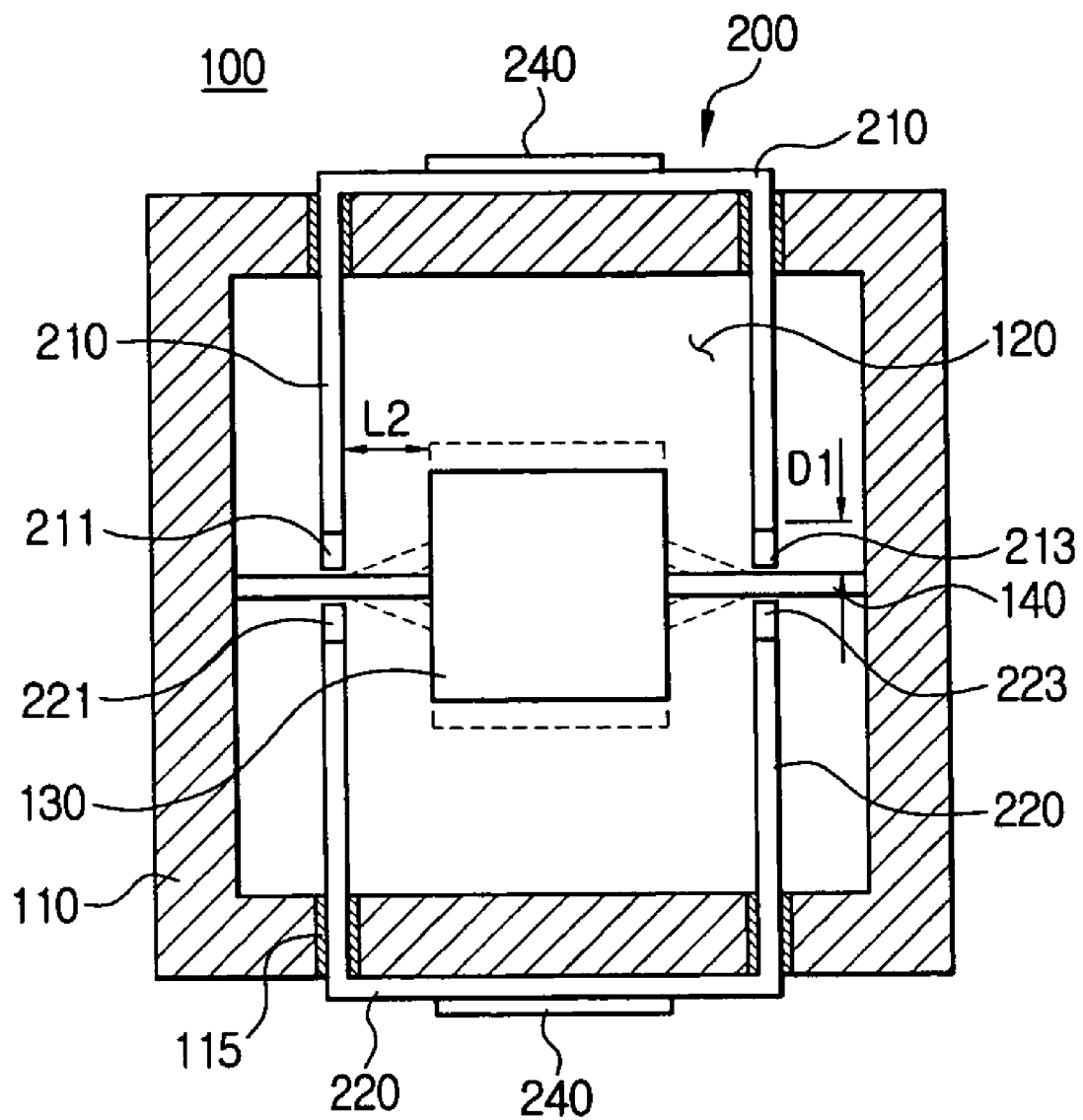
FIG. 3 is a cross-sectional view showing operation of the resonator according to the first embodiment of the present invention referring to a main body of the resonator of FIG. 2.

FIGS. 1 through 3 show a resonator according to the first embodiment of the invention. Referring to FIGS. 1 through 3, the resonator according to the first embodiment of the invention includes a vibrating body 130 and an elastic supporting body 140. The vibrating body 130 is installed at a cavity 120, which is an inner space of a main body of the resonator 110. Both ends of the elastic supporting body 140 are connected to an inner wall of the main body of the resonator 110 and to the vibrating body 130, to vibrationally support the vibrating body 130.

The resonator 100 according to the first embodiment of the invention is able to selectively modulate frequency of a vibration or waves output (referred to as a vibrating frequency, hereinafter). Towards this goal, the resonator 100 according to the first embodiment of the invention includes a frequency modulating unit 200 adjusting a vibrational length of the vibrating body 130 in vibration, out of the total length of the elastic supporting body 140. The frequency modulating unit 200 includes interference bodies 210, 220 and corresponding heat sources 240.

The interference bodies 210, 220 are installed to be partially exposed to the inner cavity 120 and include contacting parts 211, 213, 221, 223 formed at each end facing the elastic supporting body 140. The interference bodies 210, 220 according to the first embodiment of the invention have their one ends penetrating through an outer wall of the main body of the resonator 110 and exposed to the outside of the main body of the resonator 110, while the other ends are exposed to the cavity 120 of the main body of the resonator 110. The interference bodies 210, 220 according to the first embodiment of the invention are formed with length-extendable materials corresponding to the driving of the heat sources 240. That is, the interference bodies 210, 220 are made of heat expandable materials, which are restorable to the original state. The interference bodies 210, 220 are formed with metal materials enabling bulk linear changes according to temperature. The first and second interference bodies 210, 220 are paired and installed at the resonator 100. The first interference body has the first and second contacting parts 211, 213 and the second interference body has the third and fourth contacting parts 221, 223. The first and second contacting parts 211, 213 are disposed apart from the vibrating body 130 by a predetermined interval ($L_2$, refer to FIG. 3). The same relation is applied to the third and fourth contacting parts 221, 223. According to the first embodiment of the present invention, respective contacting parts 211, 213, 221, 223 are spaced away from the vibrating part 130 by $L_2$, which is half of the length $L_1$ (see FIG. 2) of the elastic supporting body 140. The first and third contacting parts 211, 221 face each other with the elastic supporting body 140 in the center, according to vibrating direction (X, refer to FIG. 1) of the elastic supporting body 140. The second and fourth contacting parts 213, 223 are arranged in the same manner.

The heat sources 240 selectively heat the respective interference bodies 210, 220. According to the first embodiment of the present invention, there is used a driving body for heat generation as the heat source 240 that is mounted to contact a part of the interference parts 210, 220 exposed to the outer circumference of the main body of the resonator 110 and generates heat when power is supplied.

References S are sensors for detecting the temperature of the corresponding heat sensor 240 or the interference bodies 210, 220, while reference C is a controller for controlling the driving of the heat sources 240 based on a signal output from the sensors (S). Reference 115 is a preventing body for heat transmission which insulates between the main body of the resonator 110 and a part of the interference bodies 210, 220 penetrating through the main body of the resonator 110. The sensors (S) and the controller (C) may heat the interference bodies 210, 220 at a constant temperature such that the length of the interference bodies 210, 220 can be more easily adjusted.

The operation of a resonator 100 with the above-mentioned structure according to the first embodiment of the present invention will now be described.

As illustrated in FIG. 2, as the vibrating body 130 vibrates without interference bodies 210, 220 being heated, the elastic supporting body 140 vibrates by a predetermined amplitude. Because respective contacting parts 211, 213, 221, 223 are spaced away by a larger interval (D1) than half of the amplitude of the elastic supporting body, contacting parts 211, 213, 221, 223 do not interfere in the vibration of the elastic supporting body 140. Accordingly, the resonator 100 is able to detect the vibration or waves of the initially intended frequency. A vibrating frequency of the elastic supporting body 140 is related to spring constant $k_1$. The spring constant $k_1$ relevant to the length of oscillable part (L1 refer to FIG. 2) which is linked to the vibration of the vibrating body 130 out of the total length of the elastic supporting body 140, as illustrated in a mathematical formula 1. In the mathematical formula 1, P is an outer force exerted to the elastic supporting body and δ is a displacement of the vibrated elastic supporting body 140. Because the remaining variables (C, E, I) are constants according to configuration or materials of the elastic supporting body 140, the description will be omitted here.

$$k_1 = \frac{P}{\delta} = \frac{P}{\frac{PL_1^3}{CEI}} = \frac{CEI}{L_1^3} \qquad \text{[Mathematical formula 1]}$$

Using the spring constant $k_2$, a vibration frequency ($\omega_1$) of the elastic supporting body 140 is calculated by the following mathematical formula 2. M in mathematical formula 2 is a mass of the elastic supporting body 140.

$$\omega_1 = \sqrt{\frac{k_1}{M}} \qquad \text{[Mathematical formula 2]}$$

As illustrated in FIG. 3, if heat sources 240 heat the corresponding interference bodies 210, 220, the interference bodies 210, 220 are lengthened and contacting parts 211, 213, 221, 223 are situated within a vibration range of the elastic supporting body 140. Accordingly, the elastic supporting body 140 contacts with contacting bodies 211, 213, 221, 223. According to an exemplary embodiment of the present invention, as illustrated in FIG. 3, it is exemplified that the interference bodies 210, 220 are lengthened enough so that contacting parts 211, 213, 221, 223 possibly contact the elastic supporting body 140 in a non-vibrating state. However, if contacting parts 211, 213, 221, 223 can be positioned within a vibrating range of the elastic supporting body 140, the interference bodies 210, 220 do not need to be lengthened as much as illustrated in FIG. 3. Because the length of the vibrated part of the elastic supporting body 140 varies according to the intervals between the contacting parts 211, 213, 221, 223 and the elastic supporting body 140 in extending the length of the interference bodies 210, 220 and accordingly, the size of the resonating frequency described later will change, consideration should be made of the frequency displacement of the contacting parts 211, 213, 221, 223 and the elastic supporting body 140 in installing the interference bodies 210, 220.

When the elastic supporting body 140 contacts the contacting parts 211, 213, 221, 223, the amplitude of the elastic supporting body 140 varies, as illustrated in FIG. 3, because the length of the vibrated part of the elastic supporting body 140 changes. The spring constant $k_2$ of the elastic supporting body 140 is calculated by the following mathematical formula 3. According to the embodiment of the present invention, there is a reduced length ($L_2$) of the vibrated part of the elastic supporting body 140 during contact between the contacting parts 211, 213, 221, 223 and the elastic supporting body 140, into half of the initial length ($L_1$). The spring constant $k_2$, as illustrated in the following mathematical formula 3, increases by 8 times more than before contact between the contacting parts 211, 213, 221, 223 and the elastic supporting body 140.

$$k_2 = \frac{CEI}{L_2^3}, L_2 = 0.5L_1 \rightarrow k_2 = \frac{CEI}{\left(\frac{L_1}{2}\right)^3} = 8k_1 \quad \text{[Mathematical formula 3]}$$

A vibration frequency ($\omega_2$) of the elastic supporting body 140 is calculated by the following mathematical formula 4.

$$\omega_2 = \sqrt{\frac{k_2}{M}}, \quad \text{[Mathematical formula 4]}$$

$$k_2 = 8k_1 \rightarrow \omega_2 = \sqrt{\frac{8k_1}{M}} = 2.83\omega_1$$

According to the calculation, when the vibration frequency ($\omega_1$) in the initial state is 1 KHz, there is an increase in the vibration frequency ($\omega_2$) to 2.83 KHz, which is extracted from the resonator 100 during contact between the contacting parts 211, 213, 221, 223 and the elastic supporting body 140. That is, it is possible to vary a vibrating frequency output from the resonator, if necessary.

Hereinafter, a resonator according to another exemplary embodiment of the present invention will be described in detail with reference to FIGS. 4 and 5.

Figure 4:
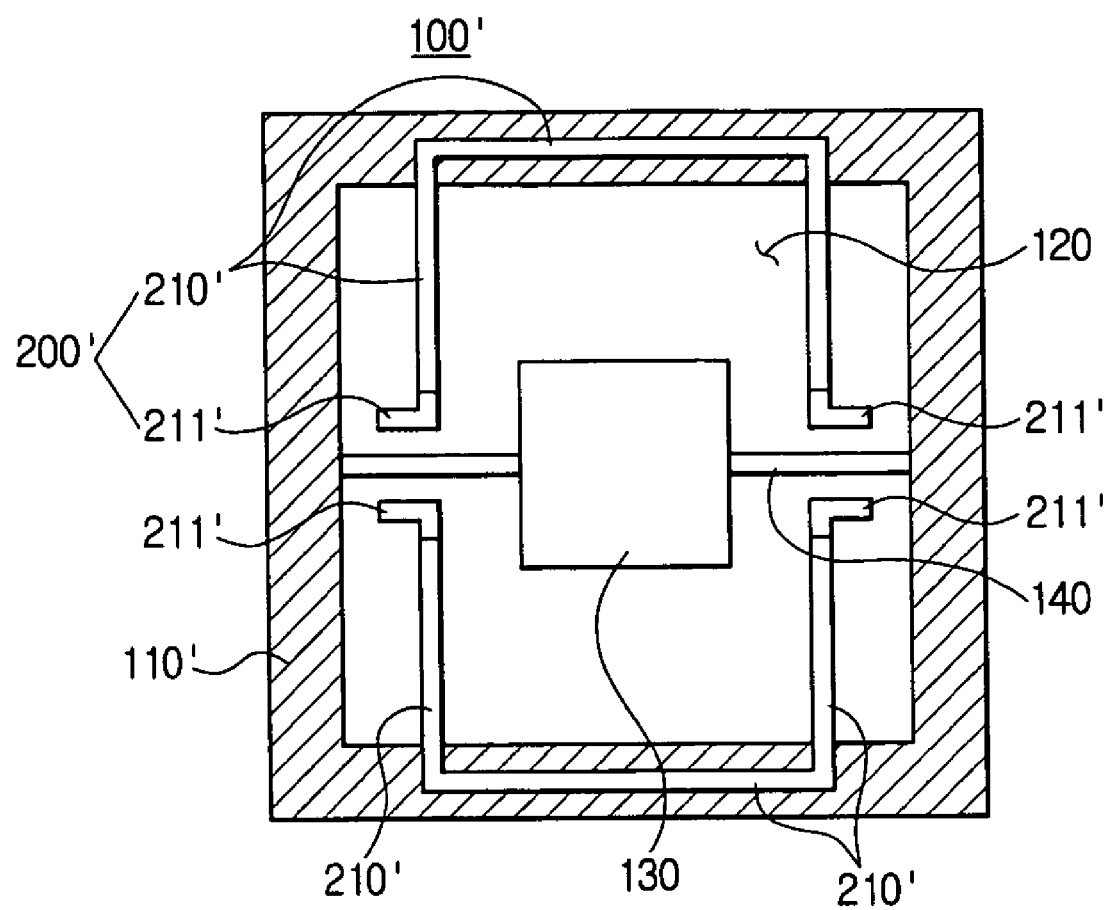
FIG. 4 is a cross-sectional view of a resonator according to a second embodiment of the present invention.

FIG. 4 shows the resonator according to a second embodiment of the present invention. Referring to FIG. 4, the resonator 100' having a main body of the resonator 110' and a frequency modulating unit 200' according to an exemplary embodiment of the present invention is mostly similar to the resonator 100 according to the first embodiment of the present invention in structure. However, there are differences as follows in the structure of an inference body 210'. Because the interference body 210 is made of materials able to generate heat when the power is supplied by a power supplier (not shown), a separate heat source 240 (refer to FIG. 2) is not needed. The contacting part 211' is formed on an end of the interference body 210' facing the elastic supporting body 140 and is bent in a parallel direction with the elastic supporting body 140 while standing still. Even if the interference body 210' is thinner than the interference bodies 210, 220 according to the first embodiment of the present invention, it is possible to obtain enough contacting space between the elastic supporting body 140 and the contacting part 211'. The contacting part 211' may be bent in various directions. If the contacting part 211' moves to the point spaced away from the elastic supporting body 140 by a predetermined distance, the contacting part 211' and the interference part 210' form an angle which enables the contacting part 211' to be parallel to the elastic supporting body 140 at a time of contacting the contacting part 211'. Similar to an embodiment of the present invention, the elastic supporting body 140 stays in a good contacting state with the contacting part 211'. Because there is a similar operation of the resonator 100' having the above-mentioned structure according to the second embodiment of the present invention as with the first embodiment of the present invention, a detailed description thereof will be omitted.

Figure 5:
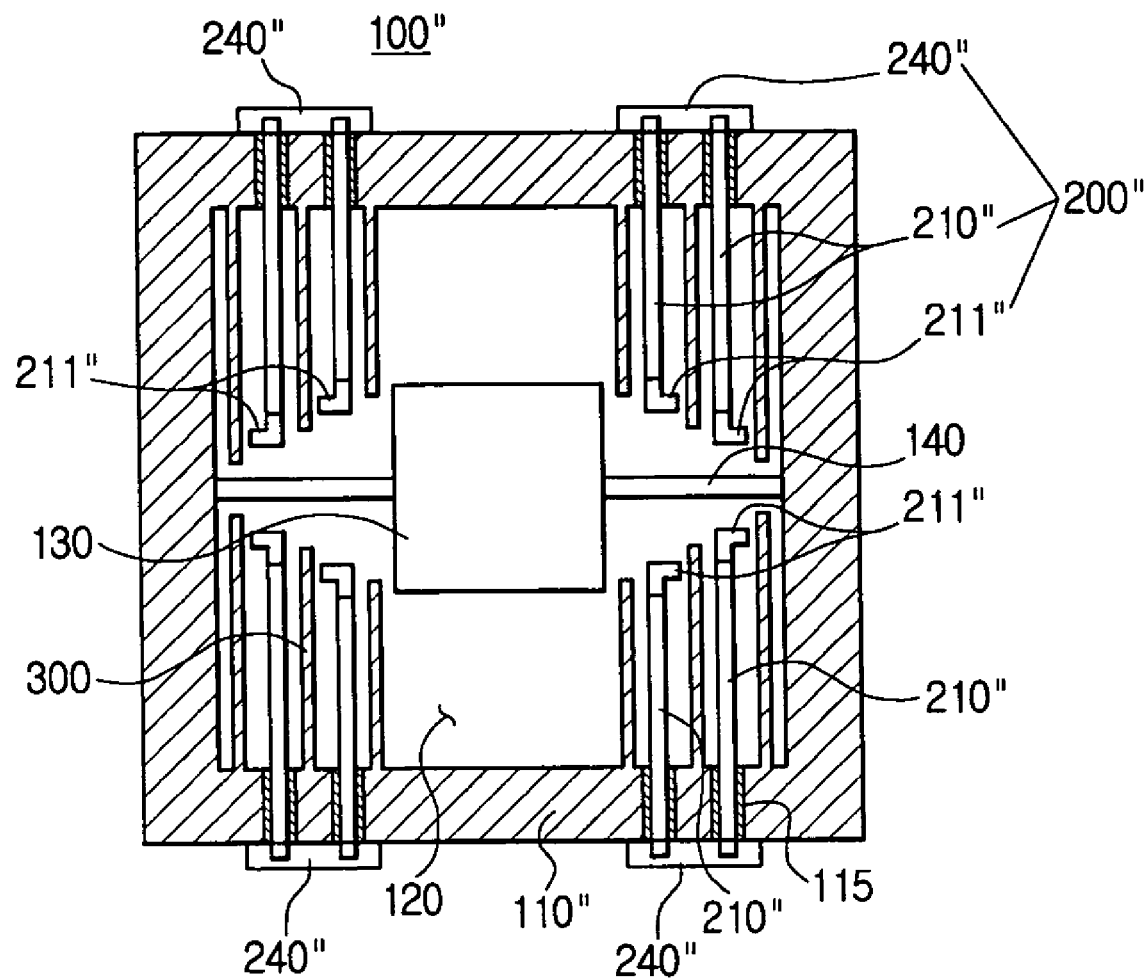
FIG. 5 is a cross-sectional view of a resonator according to a third embodiment of the present invention.

FIG. 5 is the resonator according to a third embodiment of the present invention. Referring to FIG. 5, the resonator 100" having a main body of the resonator 110" and a frequency modulating unit 200" according to the third embodiment of the present invention has more contacting parts 211" than the resonators 100, 100' of the first and second embodiments of the present invention, and a single interference body 210" supports a single contacting part 211". A heat source 240" for heating the interference body 210" is installed to correspond to each of interference bodies 210". A part of the plurality of contacting parts 211" may be selectively contacted with the elastic supporting part 140 and as a result, the resonating frequency output from the resonator 100" may be adjusted into multiple levels. The newly established contacting parts 211" are symmetrically disposed with reference to the vibrating body 130 and the elastic supporting body 140, as done in the first and second embodiments of the present invention. The multi-level adjustment of the resonating frequency is more accurately and easily performed. According to the third embodiment of the present invention, the length of interference body 210" varies, because the closer to the vibrating body 130, the bigger the amplitude of elastic supporting body 140. Accordingly, each of contacting parts 211" does not interfere in vibration of the elastic supporting body 140, while the interference body 210" is not heated. Barriers 300 are formed between the interference bodies 210" neighboring each other, between the interference body 210" and the vibrating body 130, and between the interference body 210" and the main body of the resonator 110". The barriers 300 prevent the vibrating body 130, an inner wall of the main body of the resonator 110" and an unheated interference body 210" from being indirectly heated by the interference body 210" which is being heated, such that the resonator 100" can avoid malfunction.

In order to describe the invention, it was exemplified that at ordinary times, the contacting part is spaced away from the elastic supporting body and contacts with the elastic supporting body, when it is necessary. However, it will be understood by those skilled in the art that various changes in form and details may be made therein without departing from the spirit and scope of the invention as defined by the appended claims. In contrast to the above-mentioned, the contacting part may be spaced away from the elastic supporting body, when it is necessary. The heat source heating the interference body may have a heating lamp according to the form of resonator.

It has been above described that there is a varied length of the elastic supporting body's vibrated part linked with the vibration of the vibrating body. A single resonator extracts vibrations waves of various frequencies. Accordingly, only a single resonator is needed for extracting several resonating frequencies, thereby saving costs and achieving simplification compared to the conventional products requiring a plurality of resonators.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A resonator comprising;
    a main body including a vibrating body and an elastic supporting body supporting the vibrating body; and a frequency modulating unit including a movable contacting part which is movable between a first position away from the elastic supporting body and a second position in a vicinity of the elastic supporting body, wherein a length of a vibrating part of the elastic supporting body varies according to a position of the movable contacting part.

2. The resonator as claimed in claim 1, wherein the frequency modulating unit comprises an interference body formed at least partially with length-variable materials corresponding to temperature and including the contacting part; and at least one heat source selectively heating the interference body to move the contacting part.

3. The resonator as claimed in claim 2, wherein the interference body and the contacting part are formed in a single body.

4. The resonator as claimed in claim 2, wherein the contacting part is bent-shaped in parallel with respect to a length direction of the elastic supporting body.

5. The resonator as claimed in claim 2, wherein the frequency modulating unit comprises a sensor which measures a temperature of the interference body; and a controller which controls the driving of the heat source corresponding to a signal output from the sensor.

6. The resonator as claimed in claim 5, wherein the heat source comprises a heat-generating resistance body installed on one end of the interference body.

7. The resonator as claimed in claim 6, wherein the heat-generating resistance body and the interference body are formed in a single body.

8. The resonator as claimed in claim 2, wherein the contacting part is formed at the main body of the resonator in plural numbers, while being symmetrically disposed in a vibrating direction of the elastic supporting body with reference to the elastic supporting body.

9. The resonator as claimed in claim 8, wherein the plurality of contacting parts are symmetrically disposed with reference to the vibrating body.

10. The resonator as claimed in claim 8, wherein the interference part is formed at the main body of a resonator in plural numbers, each of which is formed integrally with at least two contacting parts.

11. The resonator as claimed in claim 2, wherein a part of the interference body penetrates an outer wall of the main body of the resonator and a heat-transmission preventing body is formed between the interference body and the outer wall, to prevent heat of the interference body from being transmitted to the outer wall.

12. The resonator as claimed in claim 2, wherein the interference body is formed at the main body of the resonator in plural numbers, and barriers which prevent heat transfer among the interference bodies are formed among the respective interference bodies.

13. The resonator as claimed in claim 12, wherein the barriers are formed integrally with the outer wall of the main body of the resonator.

14. The resonator as claimed in claim 2, wherein a barrier is formed between the interference body and the vibrating body to prevent heat of the interference body from being transmitted to the vibrating body.

15. The resonator as claimed in claim 14, wherein the barrier is formed integrally with the outer wall of the main body of the resonator.

16. The resonator as claimed in claim 2, wherein a barrier is formed between the interference body and an inner wall of the main body of the resonator to prevent heat of the interference body from being transmitted to the inner wall.

17. The resonator as claimed in claim 16, wherein the barrier is formed integrally with the outer wall of the main body of the resonator.

18. The resonator as claimed in claim 1, wherein the first position is away from a vibration range of the elastic supporting body.

19. The resonator as claimed in claim 1, wherein the second position is within a vibration range of the elastic supporting body.

20. The resonator as claimed in claim 19, wherein the second position is where the contacting part and the elastic supporting body contact while the elastic supporting body stands still.

21. The resonator as claimed in claim 1, wherein the elastic supporting body comprises a first elastic supporting part and a second elastic supporting part.

22. The resonators as claimed in claim 21, wherein one end of the first elastic supporting part is connected to a first inner wall of the main body and another end of the first elastic supporting part is connected to a first side of the vibrating body.

23. The resonators as claimed in claim 22, wherein one end of the second elastic supporting part is connected to a second inner wall of the main body different from the first inner wall and another end of the second elastic supporting part is connected to a second side of the vibrating body different from the first side.

24. The resonator as claimed in claim 1, wherein the contacting part comprises at least a first contact part and a second contact part, and the first and second contact part face each other with the elastic supporting body provided in between the first and the second contact part.

25. The resonator as claimed in claim 2, further comprising a heat preventing body which insulates between the main body and a part of the interference body.

* * * * *